United States Patent [19]

Farb et al.

[11] Patent Number: 4,837,051
[45] Date of Patent: Jun. 6, 1989

[54] CONDUCTIVE PLUG FOR CONTACTS AND VIAS ON INTEGRATED CIRCUITS

[75] Inventors: Joseph E. Farb, Riverside; Maw R. Chin, Huntington Beach, both of Calif.

[73] Assignee: Hughes Aircraft Company, Los Angeles, Calif.

[21] Appl. No.: 222,308

[22] Filed: Jul. 21, 1988

Related U.S. Application Data

[63] Continuation of Ser. No. 944,641, Dec. 19, 1986, abandoned.

[51] Int. Cl.$^4$ .............................................. B05D 5/12
[52] U.S. Cl. ...................................... 427/97; 427/96; 427/99; 427/307
[58] Field of Search ...................... 427/96, 97, 99, 307

[56] References Cited

U.S. PATENT DOCUMENTS

| | | | |
|---|---|---|---|
| 4,332,839 | 6/1982 | Levinstein | 427/96 |
| 4,378,383 | 3/1983 | Moritz | 427/96 |
| 4,465,716 | 8/1984 | Baber | 427/96 |
| 4,624,864 | 11/1986 | Hartmann | 427/96 |

FOREIGN PATENT DOCUMENTS 0119497  9/1984  European Pat. Off. .
0170544  2/1986  European Pat. Off. .

OTHER PUBLICATIONS

IBM Technical Disclosure Bulletin, vol. 29, No. 1, Jun. 1986, "Variable Depth Contact Hole Preparation Utilizing A Nucleation Layer and Selective Chemical Vapor Deposition for Stud Formation", pp. 310–311.
IBM Technical Disclosure Bulletin, vol. 29, No. 3, Aug. 1986, "Low Contact Resistance, Self-Aligned Metal Stud Process", p. 1401.
S. M. SZE: "VLSI Technology", 1985, McGraw-Hill, p. 369.

*Primary Examiner*—Shrive Beck
*Assistant Examiner*—Vi Duong Dang
*Attorney, Agent, or Firm*—Terje Gudmestad; Kenneth W. Float; A. W. Karambelas

[57] ABSTRACT

A process is disclosed for filling contact or via openings in an integrated circuit with electrically conductive plugs. The process includes the steps of (a) forming one or more openings in an planarized oxide layer, where the one or more openings is disposed over and exposes semi-insulating or conductive regions, and (b) filling the one or more openings with conductive material to substantially the same level as the adjacent surfaces of the oxide layer to form respective planarized conductive plugs.

A further aspect of the invention is directed to a process which includes the steps of (a) forming first one or more openings of a first predetermined depth in a planarized oxide layer, the first one or more openings being disposed over the exposing respectively associated semi-insulating or conductive regions; (b) partially filling the first one or more openings with conductive material to a level corresponding to a second predetermined depth; (c) forming second one or more openings of the second predetermined depth in the planarized oxide layer, the second one or more openings being disposed over the exposing respectively associated semi-insulating or conductive regions; and (d) filling the first and second one or more openings to substantially the same level to form respective planarized plugs in the opeinings.

25 Claims, 5 Drawing Sheets

CONDUCTIVE PLUG FOR CONTACTS AND VIAS ON INTEGRATED CIRCUITS

This application is a continuation of application Ser. No. 944,641, filed Dec. 19, 1986 now abandoned.

BACKGROUND OF THE INVENTION

The disclosed invention relates to the provision of conductive paths between devices and a metallization layer or between metallization layers of integrated circuits, and is more particularly directed to the formation of electrically conductive plugs for interconnecting devices and metallization layers of integrated circuits.

In an integrated circuit, the devices or elements formed in the substrate are interconnected with metallic (e.g., aluminum) leads which are typically formed by the sequential processes of masking and deposition. The processes of masking and deposition shall be referred to as metallization, and generally provides for a layer of metallization on top of a layer of insulating oxide or glass. The insulating oxide or glass on which the metallization is deposited generally includes openings or windows for the formation of (a) metallized contacts to silicon or polysilicon, or (b) metallized vias to another layer of metallization.

With known metallization techniques, however, the contact and via openings or windows must be selectively located for two and three layer metallization. Such selectivity is required due to photolithographic and deposition processing limitations.

Known metallization techniques include planarized and non-planarized processing. As used herein, planarizing refers to smoothing the surface of an insulating layer prior to deposition of metal. The planarized surface may comprise a substantially continuous planar surface, or may include planar areas of different levels. In any event, the top surfaces of the insulating layer are smoothed.

Specifically, with non-planarized processing, only one opening over a given region is allowed. In other words, only one layer is allowed to have an opening over a given region. Moreover, openings have to be at least a predetermined distance from another opening. The actual distance depends on whether an adjacent opening is in the immediately adjacent oxide layer.

With planarized processing, the limitations are not as stringent. More than one opening over a given region is allowed so long as the openings are not on adjacent oxide layers. However, due to processing limitations, the tops of the deposited metal over the openings include indentations and minimum spacing between adjacent openings is required. Such spacing requirements are less stringent than for non-planarized processing.

As a result of the design rules associated with known non-planarized and planarized processing of metallization layers, routing is necessarily complex and difficult. Further, such design rules limit device density, although greater desity is achieved with planarized processing as compared to non-planarized processing.

A further consideration with known processing of metallized contacts and vias is the limitation on minimum size of the openings. Specifically, if the openings are made too small, the deposited metallization at the edges of the openings will be too thin and may crack. The limitation on minimum opening size also affects device density.

SUMMARY OF THE INVENTION

It would therefore be an advantage to provide for conductively filled integrated circuit structure contact and via openings which allow for flexibility in the location of one opening on one oxide layer relative to the location of another opening on an adjacent oxide layer.

tively filled integrated circuit structure contact and via openings which allow for efficient routing.

Another advantage would be to provide for conductively filled integrated circuit structure contact and via openings of reduced size.

Still another advantage would be to provide for conductively filled integrated circuit structure contact and via openings which allow for greater device densities.

A further advantage would be to provide for conductively filled integrated circuit structure contact and via openings which are planarized.

The foregoing and other advantages are provided by the invention in a process for filling contact or via openings in an integrated circuit with electrically conductive plugs. The process includes the steps of (a) forming one or more openings in an planarized oxide layer, the one or more openings being disposed over and exposing semi-insulating or conductive regions; and (b) filling the one or more openings with conductive material to substantially the same level as the adjacent surfaces of the oxide layer to form respective planarized conductive plugs.

A further aspect of the invention is directed to a process which includes the steps of (a) forming first one or more openings of a first predetermined depth in a planarized oxide layer, the first one or more openings being disposed over and exposing respectively associated semi-insulating or conductive regions; (b) partially filling the first one or more openings with conductive material to a level corresponding to a second predetermined depth; (c) forming second one or more openings of the second predetermined depth in the planarized oxide layer, the second one or more openings being disposed over and exposing respectively associated semi-insulating or conductive regions; and (d) filling the first and second one or more openings to substantially the same level to form respective planarized plugs in the openings.

BRIEF DESCRIPTION OF THE DRAWING

The advantages and features of the disclosed invention will readily be appreciated by persons skilled in the art from the following detailed description when read in conjunction with the accompanying drawing wherein.

DETAILED DESCRIPTION

In the following detailed description and in the several figures of the drawing, like elements are identified with like reference numerals.

Figure 1A:
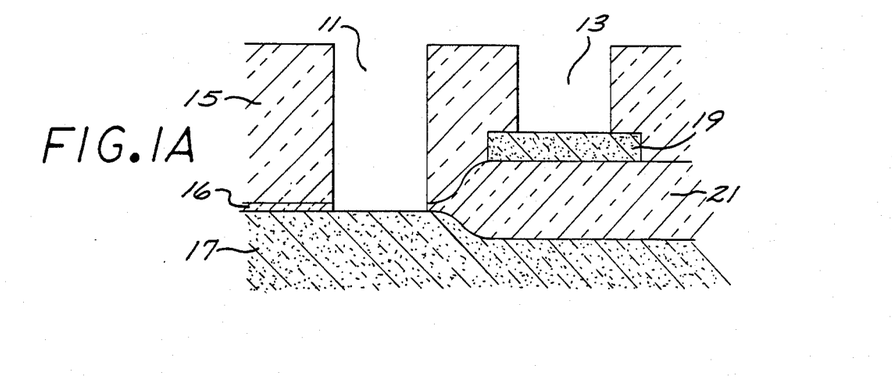
FIGS. 1A through 1D schematically illustrate an embodiment of the process of the invention.

Referring now to FIG. 1A, openings 11, 13 of different depths are formed, for example by appropriate masking and etching, in a planarized oxide layer 15. The sides of the openings 11, 13 are vertical while the bottoms of the openings and the tops of the areas between and adjacent the openings 11, 13 are horizontal. The openings 11, 13 are preferably of the same diameter.

The oxide layer 15 is shown as being formed on a thin gate oxide layer 16 which merges into a thicker field oxide layer 21. The gate oxide 16 and the field oxide 21 are formed on a substrate 17. The opening 11 exposes a portion of the substrate 17, while the opening 13 exposes a portion of a polysilicon layer 19 which is formed on the field oxide 21. The portion of the substrate 17 exposed by the opening 11 may be part of a doped region of a device, while the polysilicon layer 19 may form the gate of the device.

For ease of understanding, further embodiments of the invention are also shown as including the gate oxide layer 16, the substrate 17, the polysilicon layer 19, and the field oxide 21 shown in FIG. 1, although such structure is not shown in each figure. It should be appreciated that while the discussion herein is primarily directed to openings for contacts to silicon for ease of understanding, the invention is not so limited and clearly applies to openings for vias that interconnect metallization layers.

Figure 1B:
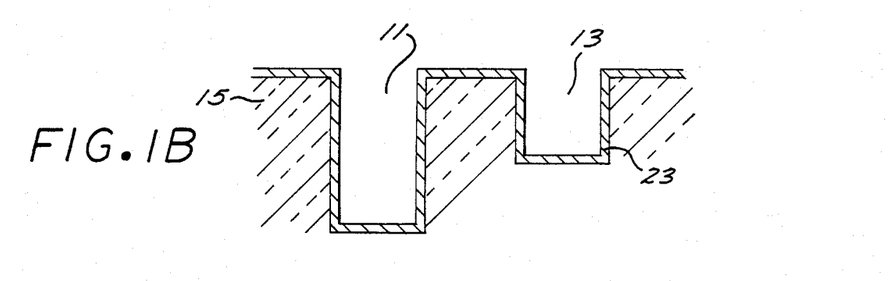

Poly or amorphous silicon is chemically vapor deposited on the structure of FIG. 1A to provide a thin (about 100 Å to 1000 Å) deposited blanket layer of silicon 23 as shown in FIG. 1B. The structure of FIG. 1B is then subjected to an anisotropic silicon etch which removes the deposited silicon layer 23 from the horizontal surfaces of the structure, while substantially leaving the deposited silicon layer 23 on the vertical surfaces. An over-etch is appropriate so that the deposited silicon layer 23 in the upper portions of the openings 11, 13 is removed to result in the structure of FIG. 1C. The over-etch prevents overfilling the openings 11, 13 with tungsten, which is selectively deposited in the next step.

Figure 1C:
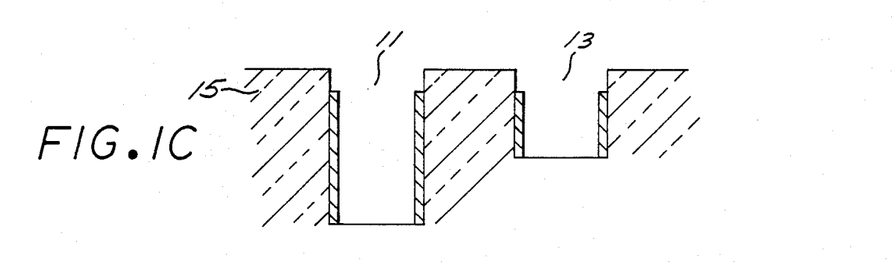

After the step of anisotropic etching, tungsten is then deposited by chemical vapor deposition. Tungsten selectively deposits to silicon and metal, and therefore the chemically vapor deposited tungsten will only deposit on the silicon at the bottom of the openings 11, 13 and on the deposited silicon layer 23 on the sides of the openings 11, 13. Since tungsten will deposit on metal, it would also deposit appropriately for via openings to a layer of metallization.

Figure 1D:
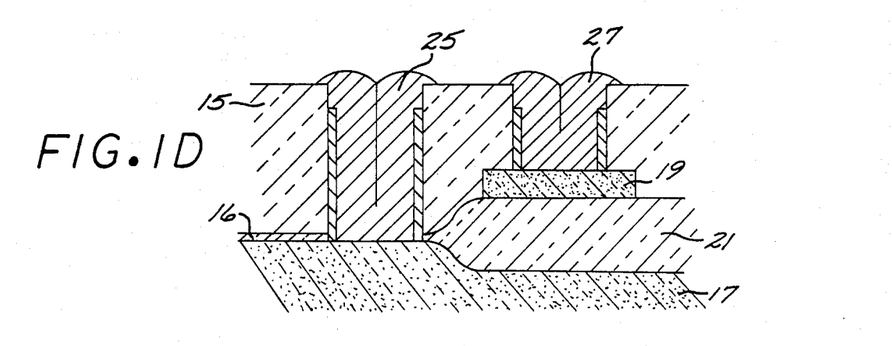

The deposition of tungsten is controlled to provide deposited planarized tungsten plugs 25, 27 which fill the openings 11, 13 as shown in FIG. 1D. Optimally, the tops of the resulting tungsten plugs 25, 27 should only be slightly above the surrounding horizontal surfaces so that the top of the structure remains planarized.

The tungsten plugs 25, 27 of FIG. 1D include centrally located vertical boundaries which schematically represent the merger of the conformal deposition growth of the tungsten. Further embodiments of the invention are also schematically shown with vertical boundaries within deposited regions for the same reason. It should be appreciated that such boundaries eventually cease to be identifiable when the deposited structures are subjected to the heating of further processing.

Figure 2A:
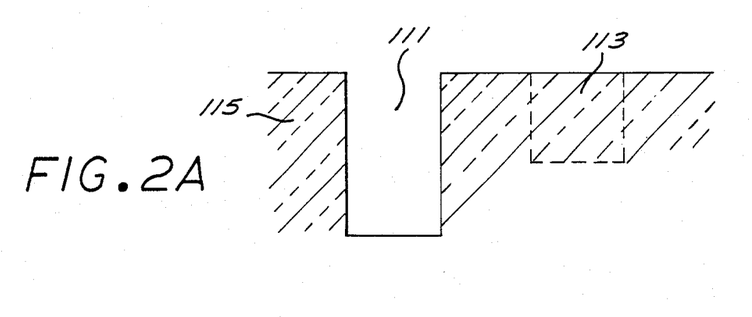
FIGS. 2A through 2C schematically illustrate another embodiment of the process of the invention.
Figure 2B:
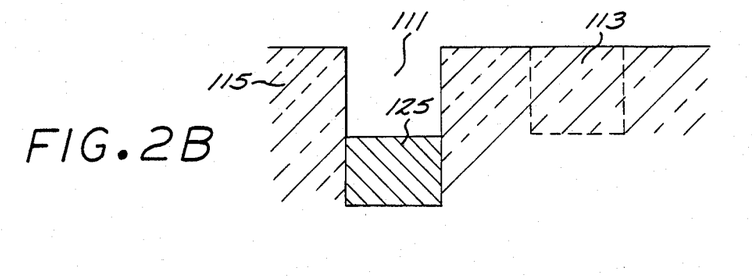
Figure 2C:
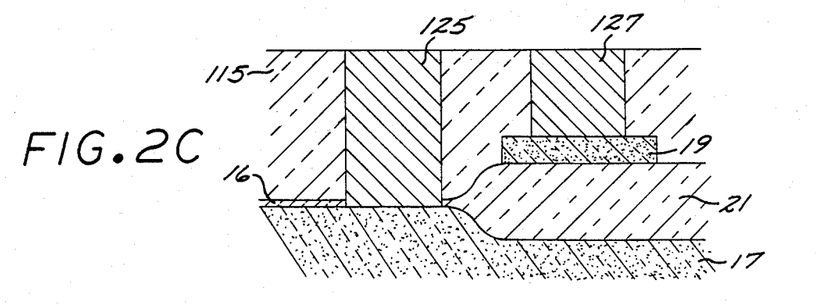

Referring now to FIGS. 2A through 2C, illustrated therein is a further technique in accordance with the invention for metallizing via or contact openings which are of different depths and which may be of different diameters. Each of the openings contemplated by this technique have bottoms that are silicon or metal as discussed above relative to FIGS. 1A through 1D.

FIG. 2A illustrates a structure having an opening 111 in a planarized oxide layer 115. By way of example, the opening 111 is formed by appropriate masking and etching. An opening 113 of shallower depth will be formed pursuant to subsequent processing, and its future location is shown in dashed lines. Tungsten is then chemically vapor deposited which causes the opening 111 to be filled from the bottom. The tungsten chemical vapor deposition is controlled to provide a tungsten plug 125 so that the depth of the partially filled opening 111 is the same as the contemplated depth of the future opening 113, as illustrated in FIG. 2B.

The opening 113 is then formed, for example by masking and etching, and tungsten is then chemically vapor deposited. Pursuant to such deposition, the openings 111, 113 are filled with deposited planarized tungsten plugs 125, 127. The chemical vapor deposition is controlled so that the tops of the deposited tungsten plugs 125, 127 are only slightly above the surrounding horizontal surfaces so that the top of the structure remains planarized. The resulting structure is illustrated in FIG. 2C.

The technique illustrated in FIGS. 2A through 2C may be advantageously utilized in applications where there are a number of different depths and diameters of contact or via openings. Such technique would utilize a specific mask and etch procedure for each contact or via opening of a given depth, which would then be followed by a chemical vapor deposition of tungsten.

The foregoing use of separate mask, etch, and partial fill steps for openings of different depths and diameters allows better alignment relative to previous layers since the use of separate masks allows for more precise control of the size and depth of the openings. For example, about a 40% improvement in alignment registration may be achieved. Also, partial filling of the openings of greater depth may provide for more planarized plugs since the openings are all uniformly filled from the bottom. As mentioned previously, the openings 111, 113 may be of different diameters, which would still provide for planarized plugs since the openings are filled from the bottom.

Figure 3A:
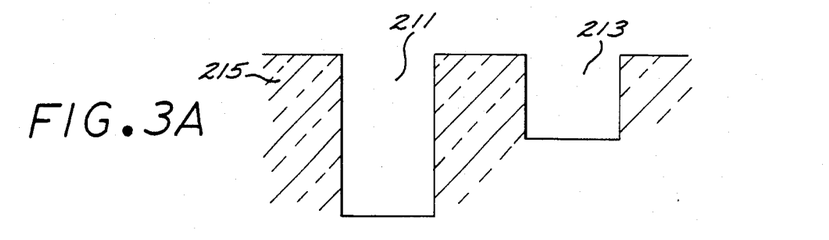
FIGS. 3A through 3D schematically illustrate still another embodiment of the process of the invention.

Referring now to FIGS. 3A through 3D, illustrated therein is a further technique contemplated by the invention for providing planarized conductively filled contact and via openings. Pursuant to this technique, openings 211, 213 of the same diameter, which may be of different depths, are formed (for example, by masking and etching) in a planarized oxide layer 215. As with other techniques contemplated by the invention, the bottoms of the openings 211, 213 may be silicon or metal. The resulting structure is illustrated in FIG. 3A.

Figure 3B:
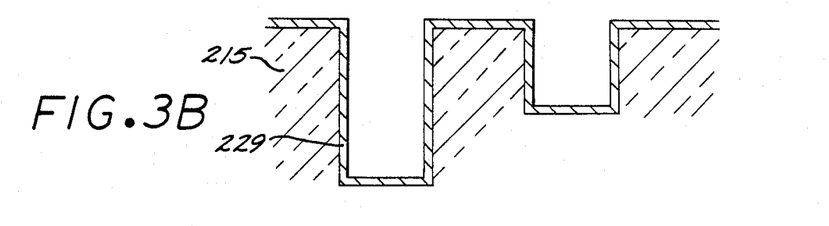

A selected material to which tungsten will deposit is then chemically vapor deposited on the structure of FIG. 3A to provide a thin (100 Å–1000 Å) deposited blanket layer of such selected material, as shown in FIG. 3B. The material may comprise a refractory metal silicide; or may comprise silicon, titanium nitride, titanium, tungsten disilicide, a titanium-tungsten alloy, tungsten nitride or other material on which tungsten will deposit.

Tungsten is then chemically vapor deposited on the structure, and the deposited layer 229 functions as an adhesive layer for the tungsten. Particularly, the contact or via openings 211, 213 are filled from the sides, and the resulting structure includes a deposited tungsten layer 231 which fills the openings 211, 213 and extends upwardly from the tops of the openings 211, 213, as illustrated in FIG. 3C.

Figure 3C:
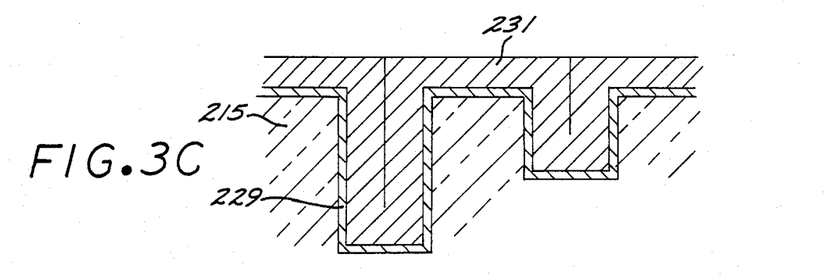
Figure 3D:
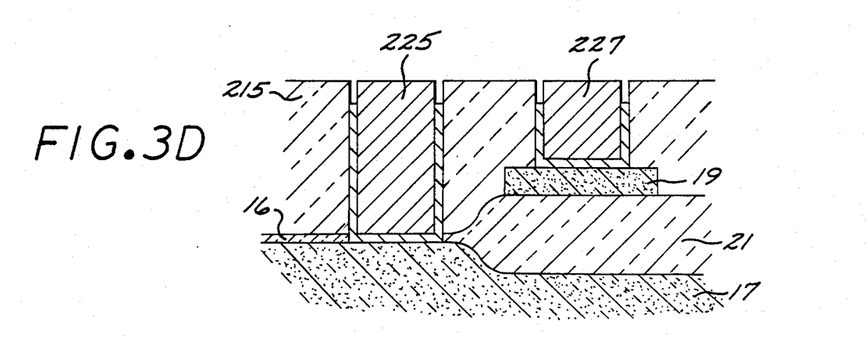

The structure of FIG. 3C is then uniformly etched until only the tungsten in the contact or via openings 211, 213 remains. The resulting structure includes planarized tungsten plugs 225, 227 in the openings 211, 213, as illustrated in FIG. 3D.

Figure 4A:
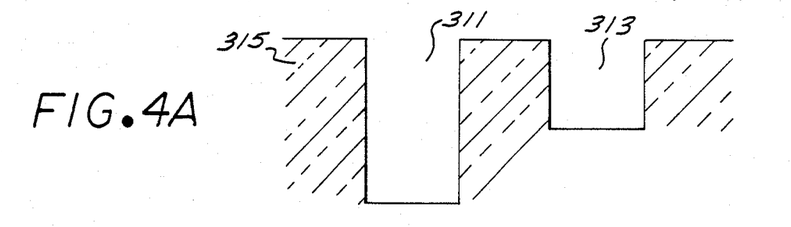
FIGS. 4A through 4E schematically illustrate a further embodiment of the process of the invention.
Figure 4B:
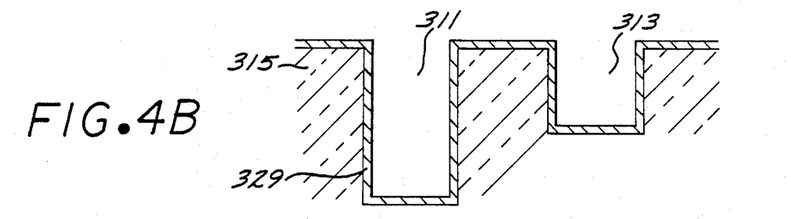

Referring now to FIGS. 4A through 4E illustrated therein is a technique contemplated by the invention for filling contact or via openings with doped polysilicon plugs. Openings 311, 313 of the same diameter, which may be of different depths, are formed in an oxide layer 315. The resulting structure is shown in FIG. 4A. A selected material is chemically vapor deposited or sputtered on the structure of FIG. 4A to provide a thin (100 Å–1000 Å) blanket deposited layer 329, as shown in FIG. 4B. The selected material functions as a diffusion barrier, and may comprise a refractory metal silicide; or may comprise titanium, titanium tungsten titanium nitride, or tungsten nitride. The resulting structure for such deposited material is shown in FIG. 4B. The deposited material may also be tungsten, but in the case of tungsten the resulting structure is different than that for the other materials and is discussed relative to FIGS. 5A–5E.

Figure 4C:
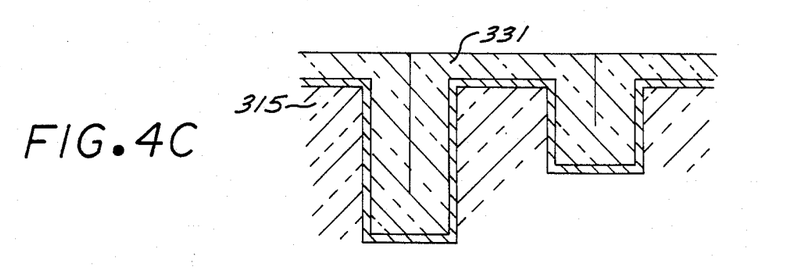
Figure 4D:
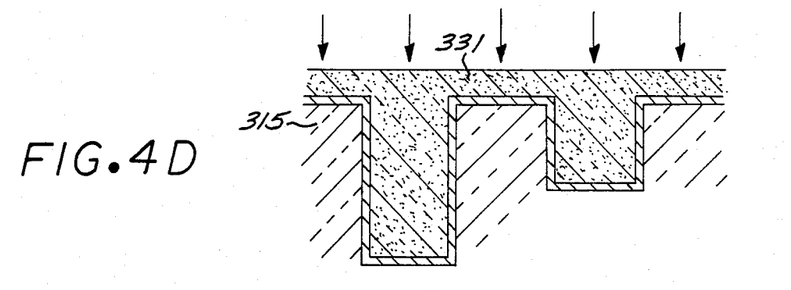
Figure 4E:
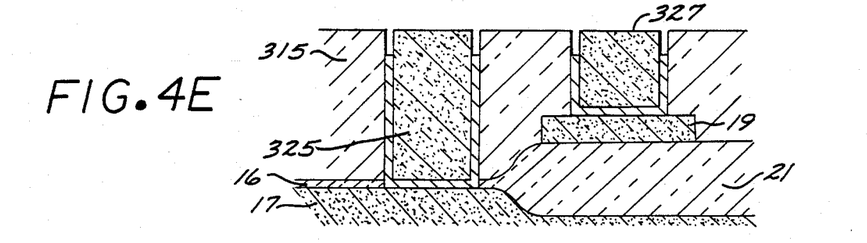

Referring further to FIG. 4B, the deposited layer 329, which is of a material other than tungsten, covers the horizontal and vertical surfaces of this structure. Silicon is then chemically vapor deposited to provide a deposited polysilicon layer 331 as illustrated in FIG. 4C. The deposited polysilicon layer 331 fills the openings 311, 313 and extends upwardly from the tops of such openings. The deposited polysilicon 331 is then doped by ion implantation, as shown in FIG. 4D. The doped polysilicon is activated by heating, and the structure is then etched to provide for planarized doped silicon plugs 325, 327 in the openings 311, 313 as shown FIG. 4E.

Figure 5A:
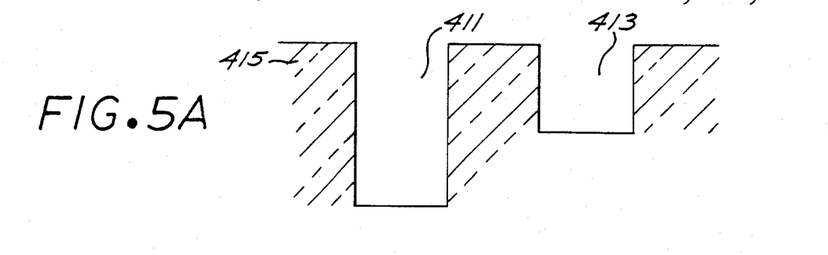
FIGS. 5A through 5E schematically illustrate a further embodiment of the process of the invention.
Figure 5B:
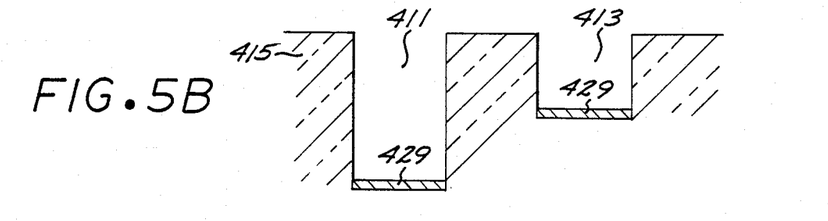
Figure 5C:
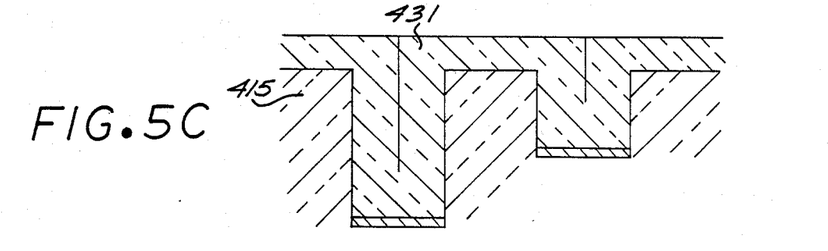

Referring now to FIGS. 5A through 5E, illustrated therein is a further technique contemplated by the invention for filling contact or via openings with doped polysilicon plugs and which utilizes tungsten as a diffusion barrier. Openings 411, 413 of the same diameter, which may be of different depths, are formed, for example by masking and etching, in an oxide layer 415 as shown in FIG. 5A. Tungsten is chemically vapor deposited, and selectively deposits to the bottoms of the openings 411, 413 since the bottoms are silicon or metal. The deposition is controlled to provide thin deposited tungsten layers 429 at the bottom of the openings 411, 413 as shown in FIG. 5B. Silicon is then deposited by chemical vapor deposition to result in the structure of FIG. 5D, which includes a deposited polysilicon layer 431. The deposited polysilicon layer 431 fills the openings 411, 413 and extends upwardly from the tops of these openings.

Figure 5D:
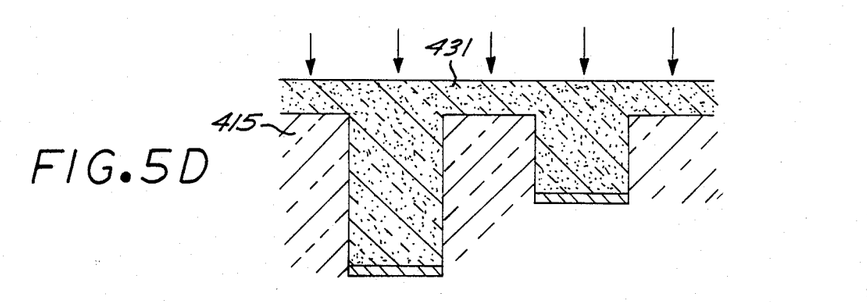
Figure 5E:
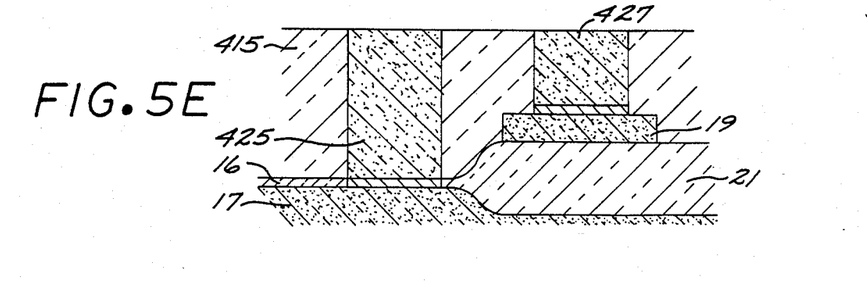

The deposited polysilicon 431 is then doped by ion implantation, as illustrated in FIG. 5D. The doped polysilicon is activated by heating, and the structure is then etched to provide the structure of FIG. 5E which includes planarized polysilicon plugs in the openings 411, 413.

It should be noted that the process illustrated in FIGS. 5A through 5E is somewhat simpler in that the etching required to planarize the plugs in the openings only has to etch through one type of material.

It should also be noted that the techniques of FIGS. 4A through 4E and FIGS. 5A through 5E may be appropriate only for filling (a) contact openings, and (b) via openings which have high temperature metals. This results from the high temperatures required for the vapor deposition of polysilicon.

With the techniques of FIGS. 4A through 4E and FIGS. 5A through 5E, the deposited diffusion barrier layers are needed only when the openings are contact openings. The barrier layer prevents counter doping of oppositely doped regions. When such techniques are used with via openings, no barrier is required, and the step of chemically vapor depositing a barrier layer is not necessary. However, as noted previously, the metal at the bottom of the via openings must have a sufficiently high melting temperature (e.g., tungsten) so that it will not melt when the silicon is vapor deposited.

While the foregoing techniques have been directed to the use of tungsten for selective deposition on certain materials such as metal and silicon, other conductive materials, such as molybdenum, which selectively deposit can also be utilized.

Also, the invention is not limited to openings to silicon or metal, and generally contemplates openings to appropriate semi-insulating or conductive regions.

The foregoing has been a disclosure of techniques for providing conductive plugs for filling contact openings and via openings. These electrically conductive plugs provide for planarized contacts and vias, and therefore for freedom of the location of contact and via openings. As a result of such freedom of placement, interconnection routing is simplified. Further, as a result of the formation of conductive plugs, the via openings may be made smaller. Also, the use of conductive plugs allows for closer spacing of contact and via openings. Still further, the foregoing techniques for providing conductive plugs readily facilitates the use of multilayer metallizations. As a result of the freedom of opening locations, reduced spacing between openings, and reduced opening size, greater device densities may be achieved.

Although the foregoing has been a description and illustration of specific embodiments of the invention, various modifications and changes thereto can be made by persons skilled in the art without departing from the scope and spirit of the invention as defined by the following claims.

What is claimed is:

1. A process for filling contact or via openings in an integrated circuit with electrically conductive plugs, said process comprising the steps of:
    forming a plurality of openings in a planarized oxide layer, said plurality of openings being disposed over and exposing semi-insulating and conductive regions of said integrated circuit, said plurality of openings having a plurality of different depths;
    providing a diffusion barrier layer on the bottom of the plurality of openings;
    chemically vapor depositing silicon to fill the plurality of openings and surfaces adjacent the openings;
    doping the deposited silicon; and etching the deposited silicon to the tops of the plurality of openings.

2. The process of claim 1 wherein the step of providing a diffusion barrier layer includes the step of providing a diffusion barrier layer comprising a refractory metal silicide.

3. The process of claim 1 wherein the step of providing a diffusion barrier layer includes the step of providing a diffusion barrier layer comprising titanium, titanium tungsten, titanium nitride, or tungsten nitride.

4. The process of claim 1 wherein the step of providing a diffusion barrier includes the step of chemically vapor depositing tungsten to form a deposited tungsten layer at the bottom of the one or more openings.

5. A process for filling contact or via openings in an integrated circuit with electrically conductive plugs, said process comprising the steps of:
   forming a plurality of openings in a planarized oxide layer, said plurality of openings being disposed over conductive metal regions of said integrated circuit, said plurality of openings having a plurality of different depths;
   chemically vapor depositing silicon to fill the plurality of openings and surfaces adjacent the openings;
   doping the deposited silicon; and etching the deposited silicon to the tops of the plurality of openings.

6. A process for filling contact or via openings in an integrated circuit with electrically conductive plugs, said process comprising the steps of:
   forming a plurality of openings in a planarized oxide layer, said plurality of openings being disposed over and exposing semi-insulating and conductive regions of said integrated circuit;
   providing a blanket layer of material on which a predetermined conductive material will deposit on the exposed surfaces of the oxide layer, the semi-insulating regions, and the conductive regions;
   depositing the predetermined conductive material to fill the plurality of openings and cover the oxide surfaces adjacent the openings; and etching the deposited conductive material and the blanket layer to the tops of the plurality of openings to form planarized conductive plugs, and to remove the deposited conductive material and the blanket layer of material from the oxide surfaces adjacent the openings.

7. The process of claim 6 wherein the step of providing a blanket layer of material comprises the step of providing a blanket layer comprising a refractory metal silicide.

8. The process of claim 6 wherein the step of providing a blanket layer of material includes the step of providing a blanket layer comprising silicon, titanium nitride, titanium, tungsten disilicide, a titaniumtungsten alloy, or tungsten nitride.

9. The process of claim 6 wherein the step of providing a blanket layer of material includes the step of vapor depositing the material.

10. A process for filling contact or via openings in an integrated circuit with electrically conductive plugs, said process comprising the steps of:
    forming a first plurality of openings having a first predetermined depth in a planarized oxide layer, said plurality of openings being disposed over and exposing semi-insulating and conductive regions of said integrated circuit;
    selectively depositing a predetermined conductive material in the first plurality of openings to a predetermined level substantially the same as a second predetermined depth of a second plurality of openings to be formed;
    forming a second plurality of openings having a second predetermined depth, said second plurality of openings being disposed and exposing semi-insulating and conductive regions of said integrated circuit; and
    selectively depositing the predetermined conductive material in said first and second plurality of openings to the surface level of said oxide layer to fill said first and second openings and form planarized conductive plugs.

11. A process for filling contact or via openings in an integrated circuit with electrically conductive plugs, said process comprising the steps of:
    forming a plurality of openings in a planarized oxide layer, said plurality of openings being disposed over and exposing semi-insulating and conductive regions of said integrated circuit;
    providing a layer of material on at least the bottom of said plurality of openings;
    depositing a semi-insulating material on said layer of material to fill the plurality of openings and cover the oxide layer surfaces adjacent said openings;
    doping said semi-insulating material to render it conductive; and
    etching said doped semi-insulating material and any of said layer of material which is outside of said openings to the tops of said plurality of openings to provide planarized conductive plugs, and to remove any of said layer of material and said doped semi-insulating material from the oxide layer surfaces adjacent said openings.

12. The process of claim 11 wherein the step of providing a layer of material comprises providing a difusion barrier layer on the bottom of said plurality of openings.

13. The process of claim 12 wherein the step of providing a diffusion barrier layer comprises the step of providing a diffusion barrier comprising titanium, titanium tungsten, titanium nitride or tungsten nitride.

14. A process for filling contact or via openings in an integrated circuit with electrically conductive plugs, said process comprising the steps of:
    forming a plurality of openings in a planarized oxide layer, said plurality of openings being disposed over and exposing semi-insulating and conductive regions of said integrated circuit;
    providing a blanket layer of material on the exposed surfaces of the oxide layer and the openings;
    depositing a semi-insulating material on said layer of material to fill the plurality of openings and cover the oxide layer surfaces adjacent said openings;
    doping said semi-insulating material to render it conductive; and
    etching said doped semi-insulating material and said layer of material outside of said openings to the tops of said plurality of openings to provide planarized conductive plugs, and to remove said layer of material and said doped semi-insulating material from the oxide layer surfaces adjacent said openings.

15. The process of claim 14 wherein the step of providing a blanket layer of material comprises the step of providing a blanket layer comprising a refractory metal silicide.

16. The process of claim 15 wherein the step of providing a blanket layer of material includes the step of providing a blanket layer comprising silicon, titanium nitride, titanium, tungsten disilicide, a titaniumtungsten alloy, or tungsten nitride.

17. The process of claim 14 wherein the step of providing a blanket layer of material includes the step of vapor depositing the material.

18. A process for filling contact or via openings in an integrated circuit with electrically conductive plugs, said process comprising the steps of:

forming a plurality of openings in a planarized oxide layer disposed on a substrate, said plurality of openings being disposed over and exposing (1) semi-insulating material comprising gate regions, and (2) doped regions in said substrate;

depositing a layer of material on the exposed surfaces of said oxide layer, said plurality of openings, said semi-insulating material and said substrate;

removing selected portions of said layer of material from said exposed surfaces to leave said layer of material only on the sidewalls of said plurality of openings; and depositing a conductive material in said plurality of openings to substantially the same level as the adjacent surface of said oxide layer to form planarized conductive plugs.

19. The process of claim 18 wherein said layer of material comprises titanium or silicon, said substrate comprises silicon, and said semi-insulating material comprises polysilicon or silicon.

20. A process for filling contact or via openings in an integrated circuit with electrically conductive plugs, said process comprising the steps of:

forming a plurality of openings in a planarized oxide layer disposed on a substrate, said plurality of openings being disposed over and exposing (1) semi-insulating material comprising gate regions, and (2) doped regions in said substrate;

depositing dopable material on the exposed surfaces of said oxide layer, said plurality of openings, said semi-insulating material and said substrate to fill said plurality of openings and cover the exposed oxide layer surfaces adjacent the openings;

doping the deposited dopable material; and etching the doped, deposited material to the level of the oxide layer and the tops of of said plurality of openings to form planarized conductive plugs, and to remove said deposited material from the oxide layer surfaces adjacent the openings.

21. The process of claim 20 wherein said step of depositing said layer of material comprises chemically vapor depositing said material to fill said plurality of openings and to cover the surfaces adjacent said openings.

22. The process of claim 21 wherein said deposited material comprises silicon or polysilicon.

23. The process of claim 21 wherein said deposited material comprises silicon or polysilicon, said substrate comprises silicon, and said semi-insulating material comprises polysilicon or silicon.

24. A process for filling contact or via openings in an integrated circuit with electrically conductive plugs, said process comprising the steps of:

forming a plurality of openings in a planarized oxide layer disposed on a substrate, said plurality of openings being disposed over and exposing (1) semi-insulating material comprising gate regions, and (2) doped regions in said substrate;

selectively depositing a barrier layer on the exposed surfaces of said semi-insulating material and said doped substrate regions at the bottom of said openings;

depositing dopable material to fill said plurality of openings and cover the oxide layer surfaces adjacent said openings;

doping the deposited dopable material; and etching the doped deposited layer of material to the level of said oxide layer and the tops of said plurality of openings to form planarized conductive plugs, and to remove the doped deposited material from the oxide surfaces adjacent said openings.

25. The process of claim 24 wherein said barrier layer comprises titanium or silicon, said substrate comprises silicon, and said semi-insulating material comprises polysilicon or silicon.

* * * * *